(12) United States Patent
Jung et al.

(10) Patent No.: US 9,940,998 B2
(45) Date of Patent: Apr. 10, 2018

(54) MEMORY CELL, MEMORY DEVICE, AND ELECTRONIC DEVICE HAVING THE SAME

(71) Applicant: SAMSUNG ELECTRONICS CO., LTD., Suwon-si, Gyeonggi-do (KR)

(72) Inventors: Jong-Hoon Jung, Seongnam-si (KR); Sung-Hyun Park, Hwaseong-si (KR); Woo-Jin Rim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/469,037

(22) Filed: Mar. 24, 2017

(65) Prior Publication Data
US 2018/0005692 A1   Jan. 4, 2018

(30) Foreign Application Priority Data
Jun. 30, 2016   (KR) .......................... 10-2016-0082768

(51) Int. Cl.
  *G11C 11/00* (2006.01)
  *G11C 11/419* (2006.01)
  *G11C 11/418* (2006.01)

(52) U.S. Cl.
  CPC .......... *G11C 11/419* (2013.01); *G11C 11/418* (2013.01)

(58) Field of Classification Search
  CPC ...... G11C 11/00; G11C 11/419; G11C 11/418
  USPC ....................................................... 365/154
  See application file for complete search history.

(56) References Cited

U.S. PATENT DOCUMENTS

| | | | |
|---|---|---|---|
| 5,426,603 A * | 6/1995 | Nakamura | .......... G11C 11/4091 365/149 |
| 5,991,217 A | 11/1999 | Tavrow et al. | |
| 6,657,880 B1 | 12/2003 | Callahan | |
| 6,839,268 B2 | 1/2005 | Osada et al. | |
| 7,663,942 B2 | 2/2010 | Kushida | |
| 8,264,010 B2 | 9/2012 | Tang et al. | |
| 8,411,513 B2 | 4/2013 | Carman | |
| 9,070,432 B2 | 6/2015 | Hsieh et al. | |
| 9,236,113 B2 | 1/2016 | Holla et al. | |
| 2013/0250646 A1 | 9/2013 | Iida | |
| 2015/0138865 A1 | 5/2015 | Takemura | |
| 2015/0146476 A1 | 5/2015 | Zhang et al. | |

* cited by examiner

*Primary Examiner* — Harry W Byrne
(74) *Attorney, Agent, or Firm* — F. Chau & Associates, LLC

(57) ABSTRACT

A memory device includes a memory cell array including a plurality of memory cells, a plurality of word lines connected to the plurality of memory cells, a plurality of bit lines connected to the plurality of memory cells, a plurality of complementary bit lines connected to the plurality of memory cells, a plurality of auxiliary bit lines, a plurality of auxiliary complementary bit lines, and a switch circuit. The switch circuit electrically connects the plurality of auxiliary bit lines to the plurality of bit lines during a write operation, electrically connects the plurality of auxiliary complementary bit lines to the plurality of complementary bit lines during the write operation, electrically disconnects the plurality of auxiliary bit lines from the plurality of bit lines during a read operation, and electrically disconnects the plurality of auxiliary complementary bit lines from the plurality of complementary bit lines during the read operation.

20 Claims, 9 Drawing Sheets

MEMORY CELL, MEMORY DEVICE, AND ELECTRONIC DEVICE HAVING THE SAME

CROSS-REFERENCE TO RELATED APPLICATIONS

This application claims priority under 35 USC §119 to Korean Patent Application No. 10-2016-0082768, filed on Jun. 30, 2016, the disclosure of which is hereby incorporated by reference in its entirety.

TECHNICAL FIELD

Exemplary embodiments of the inventive concept relate to a semiconductor device, and more particularly, to a memory cell and a memory device having the memory cell.

DISCUSSION OF THE RELATED ART

A static random access memory (SRAM) device typically stores data in a latch circuit of a memory cell through a bit line and a complementary bit line during a write operation, and reads data stored in the latch circuit of the memory cell by sensing a voltage difference between the bit line and the complementary bit line, which is determined based on the data stored in the latch circuit of the memory cell, during a read operation.

In the SRAM device, performance of the write operation typically increases and performance of the read operation typically decreases when a width of the bit line and the complementary bit line is relatively great. Alternatively, performance of the write operation typically decreases and performance of the read operation typically increases when a width of the bit line and the complementary bit line is relatively small.

SUMMARY

Exemplary embodiments of the inventive concept provide a memory cell that increases both performance of a write operation and performance of a read operation.

Exemplary embodiments of the inventive concept provide a memory device including the memory cell.

According to an exemplary embodiment, a memory device includes a memory cell array including a plurality of memory cells, a plurality of word lines connected to the plurality of memory cells, a plurality of bit lines connected to the plurality of memory cells, a plurality of complementary bit lines connected to the plurality of memory cells, a plurality of auxiliary bit lines, a plurality of auxiliary complementary bit lines, and a switch circuit. The switch circuit electrically connects the plurality of auxiliary bit lines to the plurality of bit lines during a write operation, electrically connects the plurality of auxiliary complementary bit lines to the plurality of complementary bit lines during the write operation, electrically disconnects the plurality of auxiliary bit lines from the plurality of bit lines during a read operation, and electrically disconnects the plurality of auxiliary complementary bit lines from the plurality of complementary bit lines during the read operation.

According to an exemplary embodiment, a memory device includes a memory cell that stores a single bit, a word line connected to the memory cell, a bit line connected to the memory cell, a complementary bit line connected to the memory cell, an auxiliary bit line, an auxiliary complementary bit line, and a switch circuit. The switch circuit electrically connects the auxiliary bit line to the bit line during a write operation, electrically connects the auxiliary complementary bit line to the complementary bit line during the write operation, electrically disconnects the auxiliary bit line from the bit line during a read operation, and electrically disconnects the auxiliary complementary bit line from the complementary bit line during the read operation.

According to an exemplary embodiment, a memory device includes a memory cell array including a plurality of memory cells, a plurality of word lines connected to the plurality of memory cells, a plurality of bit lines connected to the plurality of memory cells, a plurality of complementary bit lines connected to the plurality of memory cells, a plurality of auxiliary bit lines, a plurality of auxiliary complementary bit lines, and a switch circuit. The switch circuit electrically connects the plurality of auxiliary bit lines to the plurality of bit lines in response to receiving a write signal having a first value indicating a write operation, electrically connects the plurality of auxiliary complementary bit lines to the plurality of complementary bit lines in response to receiving the write signal having the first value indicating the write operation, electrically disconnects the plurality of auxiliary bit lines from the plurality of bit lines in response to receiving the write signal having a second value indicating a read operation, and electrically disconnects the plurality of auxiliary complementary bit lines from the plurality of complementary bit lines in response to receiving the write signal having the second value indicating the read operation.

According to an exemplary embodiment, a memory device includes a memory cell that stores a single bit, a word line connected to the memory cell, a bit line connected to the memory cell, a complementary bit line connected to the memory cell, an auxiliary bit line, an auxiliary complementary bit line, a first switch connected between the bit line and the auxiliary bit line, and a second switch connected between the complementary bit line and the auxiliary complementary bit line. The first switch electrically connects the auxiliary bit line to the bit line in response to receiving a write signal having a first value indicating a write operation, and electrically disconnects the auxiliary bit line from the bit line in response to receiving the write signal having a second value indicating a read operation. The second switch electrically connects the auxiliary complementary bit line to the complementary bit line in response to receiving the write signal having the first value indicating the write operation, and electrically disconnects the auxiliary complementary bit line from the complementary bit line in response to receiving the write signal having the second value indicating the read operation.

According to an exemplary embodiment, a memory cell includes a word line, a bit line, a complementary bit line, an auxiliary bit line, an auxiliary complementary bit line, a data storage circuit, a first transistor, and a second transistor. The data storage circuit stores one bit of data. The first transistor is coupled between the bit line and a first electrode of the data storage circuit, and includes a gate coupled to the word line. The second transistor is coupled between the complementary bit line and a second electrode of the data storage circuit, and includes a gate coupled to the word line. The auxiliary bit line is electrically connected to the bit line, and the auxiliary complementary bit line is electrically connected to the complementary bit line during a write operation. The auxiliary bit line is electrically disconnected from the bit line, and the auxiliary complementary bit line is electrically disconnected from the complementary bit line during a read operation.

According to an exemplary embodiment, a memory device includes a memory cell array, a plurality of auxiliary bit lines, a plurality of auxiliary complementary bit lines, and a switch circuit. The memory cell array includes a plurality of memory cells coupled to a plurality of word lines, a plurality of bit lines, and a plurality of complementary bit lines. The plurality of auxiliary bit lines are substantially parallel to the plurality of bit lines. The plurality of auxiliary complementary bit lines are substantially parallel to the plurality of complementary bit lines. The switch circuit is turned on during a write operation to electrically connect the plurality of auxiliary bit lines to the plurality of bit lines, respectively, and to electrically connect the plurality of auxiliary complementary bit lines to the plurality of complementary bit lines, respectively. The switch circuit is turned off during a read operation to electrically disconnect the plurality of auxiliary bit lines from the plurality of bit lines, respectively, and to electrically disconnect the plurality of auxiliary complementary bit lines from the plurality of complementary bit lines, respectively.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
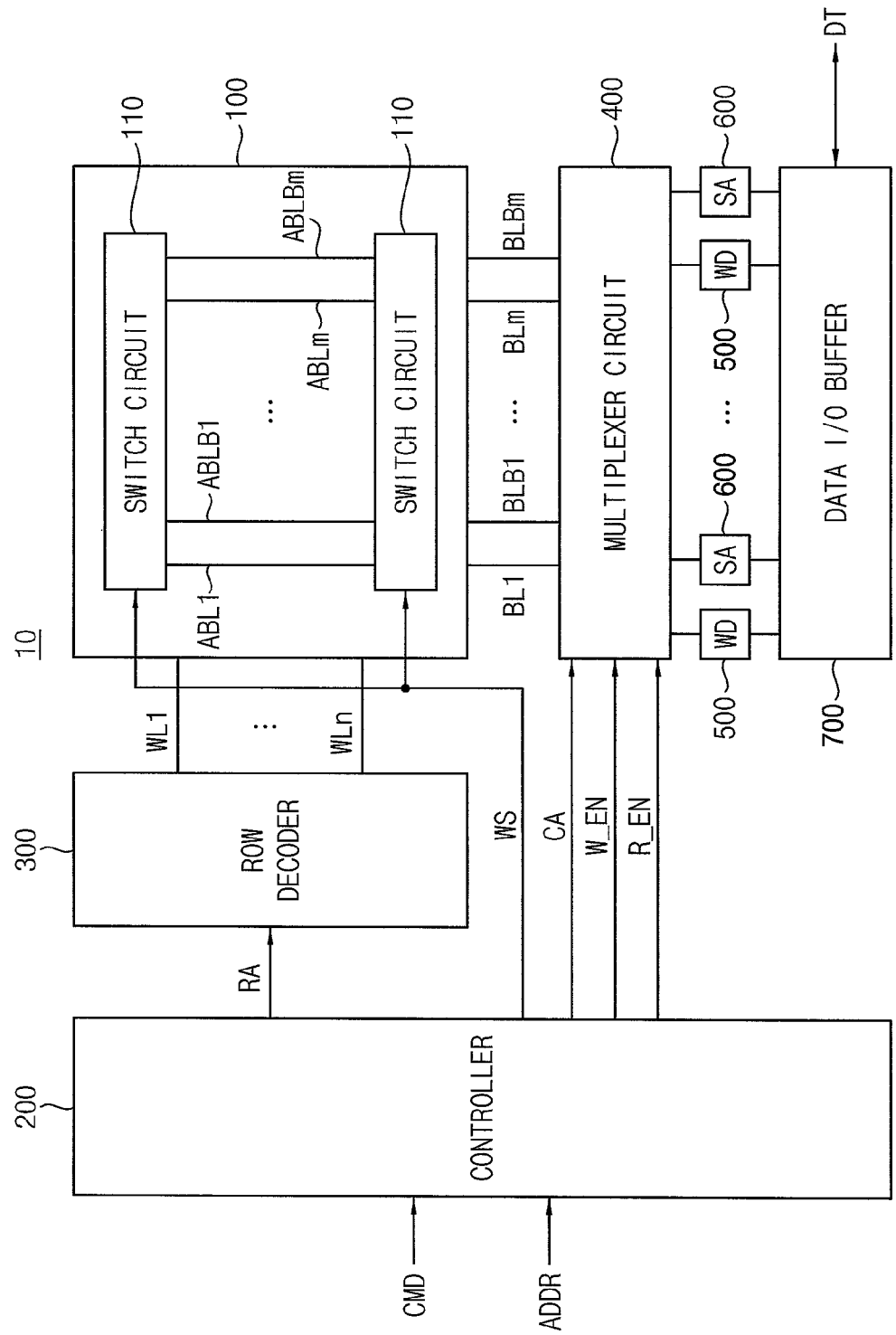
FIG. 1 is a block diagram illustrating a memory device according to an exemplary embodiment of the inventive concept.

Exemplary embodiments of the present inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

It will be understood that the terms "first," "second," "third," etc. are used herein to distinguish one element from another, and the elements are not limited by these terms. Thus, a "first" element in an exemplary embodiment may be described as a "second" element in another exemplary embodiment. As used herein, the singular forms "an" and "the" are intended to include the plural forms as well, unless the context clearly indicates otherwise.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. Further, when two processes are described as being performed substantially simultaneously or at substantially the same time as each other, it is to be understood that the processes may be performed at exactly the same time or at about the same time as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art FIG. 1 is a block diagram illustrating a memory device according to an exemplary embodiment of the inventive concept.

Referring to FIG. 1, a memory device 10 includes a memory cell array 100, a controller (also referred to as a controller circuit) 200, a row decoder (also referred to as a row decoder circuit) 300, a multiplexer (also referred to as a multiplexer circuit) 400, a plurality of write drivers (also referred to as write driver circuits) 500 connected to the multiplexer circuit 400, a plurality of sense amplifiers (also referred to as sense amplifier circuits) 600 connected to the multiplexer circuit 400, and a data input/output (I/O) buffer (also referred to as a data I/O buffer circuit) 700.

In exemplary embodiments, the memory device 10 may be a static random access memory (SRAM) device. However, the memory device 10 is not limited thereto.

The memory cell array 100 may include a plurality of memory cells arranged in rows and columns. The plurality of memory cells may be connected to first through n-th word lines WL1~WLn, first through m-th bit lines BL1~B1m, and first through m-th complementary bit lines BLB1~BLBm. Here, n and in represent positive integers. Each of the plurality of memory cells may be, for example, a SRAM cell. However, each of the plurality of memory cells is not limited thereto.

The controller 200 may control an operation of the memory device 10 based on a command signal CMD and an address signal ADDR. The command signal CMD and the address signal ADDR may be received from an external device (e.g., a device external to the memory device 10).

The controller 200 may generate a row address RA and a column address CA based on the address signal ADDR, provide the row address RA to the row decoder 300, and provide the column address CA to the multiplexer circuit 400. In addition, the controller 200 may generate a write enable signal W_EN and a read enable signal R_EN based on the command signal CMD, and provide the write enable signal W_EN and the read enable signal R_EN to the multiplexer circuit 400.

The row decoder 300 may be coupled to the memory cell array 100 through the first through n-th word lines WL1~WLn. The row decoder 300 may decode the row address RA provided from the controller 200, and select one of a plurality of rows included in the memory cell array 100 by activating one of the first through n-th word lines WL1~WLn corresponding to the row address RA. For example, the row decoder 300 may apply a word line driving voltage to a word line corresponding to the row address RA.

The multiplexer circuit 400 may be coupled to the memory cell array 100 through the first through math bit lines BL1~BLm and the first through m-th complementary bit lines BLB1~BLBm. The multiplexer circuit 400 may decode the column address CA provided from the controller 200, and select a bit line and a complementary bit line from among the first through m-th bit lines BL1~BLm and the first through m-th complementary bit lines BLB1~BLBm corresponding to the column address CA.

In addition, when the write enable signal W_EN which is provided from the controller 200, is activated, the multiplexer circuit 400 may couple the write driver 500 from among the write driver 500 and the sense amplifier 600 of a column corresponding to the column address CA to the selected bit line and the selected complementary bit line. For example, the multiplexer circuit 400 may connect a write driver 500 from among the plurality of write drivers 500 that corresponds to the column address CA to the selected bit line and the selected complementary bit line when the write enable signal W_EN is activated. In this case, the data I/O buffer 700 may provide data DT received from an external device to the write driver 500 that corresponds to the column address CA, and the write driver 500 that corresponds to the column address CA may store the data DT in the memory cell array 100 through the selected bit line and the selected complementary bit line.

Alternatively, when the read enable signal R_EN, which is provided from the controller 200, is activated, the multiplexer circuit 400 may couple the sense amplifier 600 from among the write driver 500 and the sense amplifier 600 of a column corresponding to the column address CA to the selected bit line and the selected complementary bit line. For example, the multiplexer circuit 400 may connect a sense amplifier 600 from among the plurality of sense amplifiers 600 that corresponds to the column address CA to the selected bit line and the selected complementary bit line when the read enable signal R_EN is activated. In this case, the sense amplifier 600 that corresponds to the column address CA may generate read data DT based on a voltage of the selected bit line and a voltage of the selected complementary bit line, and the data I/O buffer 700 may provide the data DT received from the sense amplifier 600 that corresponds to the column address CA to the external device.

As illustrated in FIG. 1, the memory cell array 100 included in the memory device 10 may further include first through m-th auxiliary bit lines ABL1~ABLm, which extend substantially parallel to the first through m-th bit lines BL1~BLm, and first through m-th auxiliary complementary bit lines ABLB1~ABLBm, which extend substantially parallel to the first through m-th complementary bit lines BLB1~BLBm.

In addition, the memory cell array 100 included in the memory device 10 may further include a switch circuit 110 coupled between the first through m-th bit lines BL1~BLm and the first through m-th auxiliary bit lines ABL1~ABLm, and between the first through m-th complementary bit lines BLB1~BLBm and the first through m-th auxiliary complementary bit lines ABLB1~ABLBm. In exemplary embodiments, the switch circuit 110 may be turned on in response to a write signal WS provided by the controller 200.

During a write operation, the controller 200 may provide the write signal WS in an activated state to the switch circuit 110. In this case, the switch circuit 110 may be turned on in response to the write signal WS in the activated state, such that the first through m-th auxiliary bit lines ABL1~ABLm are electrically connected to the first through m-th bit lines BL1~BLm, respectively, and the first through m-th auxiliary complementary bit lines ABLB1~ABLBm are electrically connected to the first through m-th complementary bit lines BLB1~BLBm, respectively. Thus, the memory device 10 may perform a write operation when the write signal WS is activated.

During a read operation, the controller 200 may provide the write signal WS in a deactivated state to the switch circuit 110. In this case, the switch circuit 110 may be turned off in response to the write signal WS in the deactivated state, such that the first through m-th auxiliary bit lines ABL1~ABLm are electrically disconnected from the first through m-th bit lines BL1~BLm, respectively, and the first through m-th auxiliary complementary bit lines ABLB1~ABLBm are electrically disconnected from the first through m-th complementary bit lines BLB1~BLBm, respectively. Thus, the memory device 10 may perform a read operation when the write signal WS is deactivated.

For example, in an exemplary embodiment, the write signal WS may have a first value indicating a write operation, and a second value indicating a read operation. In response to receiving the write signal having the first value indicating the write operation, the switch circuit 110 may electrically connect the plurality of auxiliary bit lines ABL1~ABLm to the plurality of bit lines BL1~BLm, and may electrically connect the plurality of auxiliary complementary bit lines ABLB1~ABLBm to the plurality of complementary bit lines BLB1~BLBm. In response to receiving the write signal having the second value indicating the read operation, the switch circuit 110 may electrically disconnect the plurality of auxiliary bit lines ABL1~ABLm from the plurality of bit lines BL1~BLm, and may electrically disconnect the plurality of auxiliary complementary bit lines ABLB1~ABLBm from the plurality of complementary bit lines BLB1~BLBm.

Figure 2:
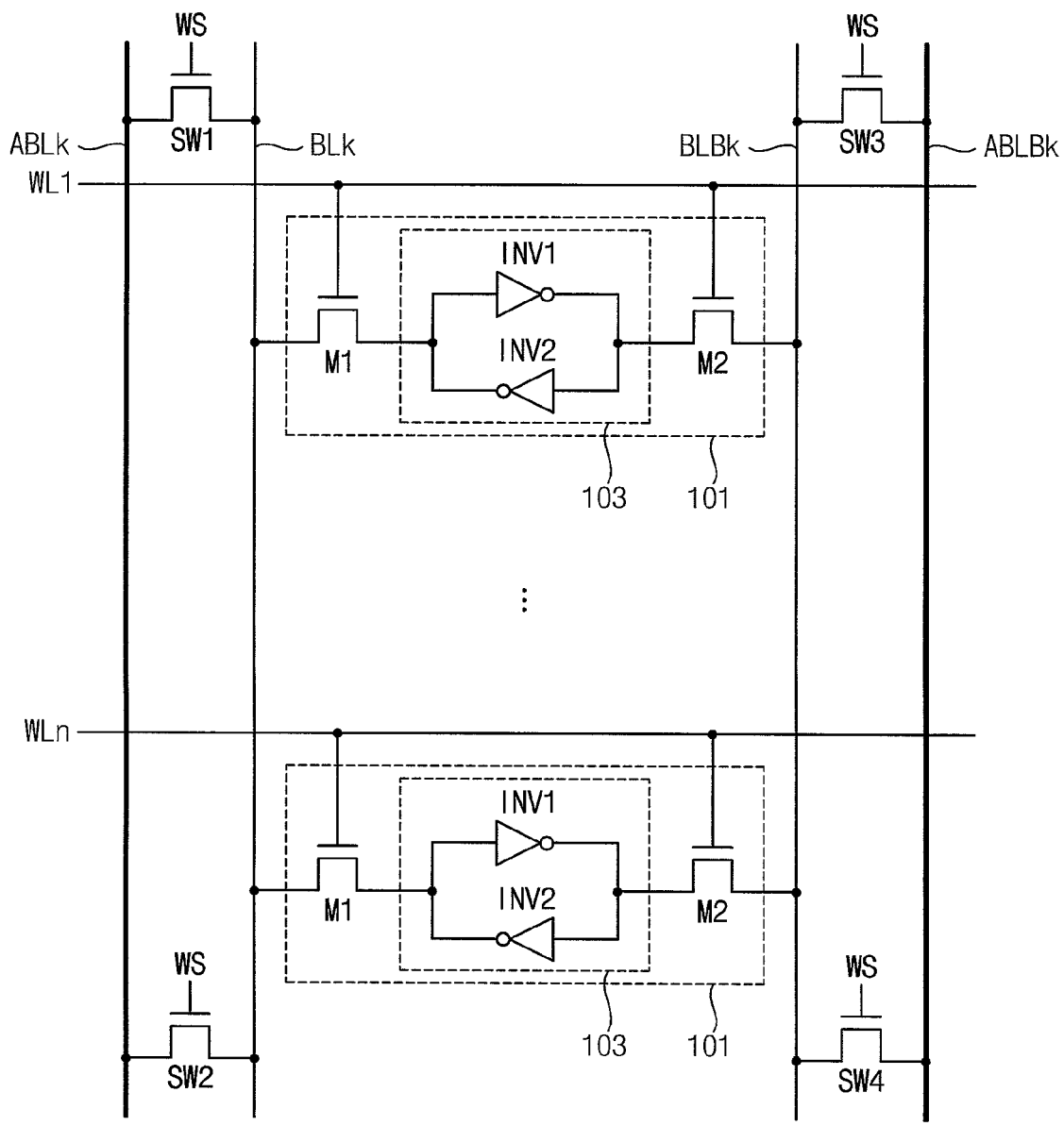
FIG. 2 is a circuit diagram illustrating an example of a memory cell array included in the memory device of FIG. 1 according to an exemplary embodiment of the inventive concept.

FIG. 2 is a circuit diagram illustrating an example of a memory cell array included in the memory device of FIG. 1 according to an exemplary embodiment of the inventive concept.

For convenience of explanation, only memory cells included in a k-th column from among first through m-th columns are illustrated in FIG. 2. Here, k represents a positive integer equal to or less than m. It is to be understood that memory cells included in columns other than the k-th column have a similar structure and configuration as the memory cells described with reference to FIG. 2.

Referring to FIG. 2, the k-th column of the memory cell array 100 may include first through n-th memory cells 101 coupled to the first through n-th word lines WL1~WLn, respectively.

Since structures of the plurality of memory cells 101 included in the memory cell array 100 are the same, for convenience of explanation, only a structure of a memory cell 101 coupled to the first word line WL1 in the k-th column will be described herein.

The memory cell 101 may include a first transistor M1, a second transistor M2, and a data storage circuit 103.

The data storage circuit 103 may store one bit of data.

In exemplary embodiments, the data storage circuit 103 may include a first inverter INV1 and a second inverter INV2.

An output electrode of the first inverter INV1 may be coupled to an input electrode of the second inverter INV2, and an output electrode of the second inverter INV2 may be coupled to an input electrode of the first inverter INV1, such that the first inverter INV1 and the second inverter INV2 form a latch circuit.

The first transistor M1 may be coupled between the k-th bit line BLk and the input electrode of the first inverter INV1. The first transistor M1 may include a gate coupled to the first word line WL1.

The second transistor M2 may be coupled between the k-th complementary bit line BLBk and the input electrode of the second inverter INV2. The second transistor M2 may include a gate coupled to the first word line WL1.

Each of the plurality of memory cells 101 included in the memory cell array 100 may have the same structure as the structure of the memory cell 101 coupled to the first word line WL1 in the k-th column as shown in FIG. 2.

As described above, the memory cell array 100 may further include the switch circuit 110 coupled between the first through m-th bit lines BL1~BLm and the first through m-th auxiliary bit lines ABL1~ABLm, and between the first through m-th complementary bit lines BLB1~BLBm and the first through m-th auxiliary complementary bit lines ABLB1~ABLBm.

As illustrated in FIG. 2, the switch circuit 110 may include a plurality of first switches SW1, a plurality of second switches SW2, a plurality of third switches SW3, and a plurality of fourth switches SW4. Each of the first through m-th columns of the memory cell array 100 may include one of the first switches SW1, one of the second switches SW2, one of the third switches SW3, and one of the fourth switches SW4.

Referring to FIG. 2, the first switch SW1 may be coupled between a first end of the k-th bit line BLk and a first end of the k-th auxiliary bit line ABLk. The second switch SW2 may be coupled between a second end of the k-th bit line BLk and a second end of the k-th auxiliary bit line ABLk. The third switch SW3 may be coupled between a first end of the k-th complementary bit line BLBk and a first end of the k-th auxiliary complementary bit line ABLBk. The fourth switch SW4 may be coupled between a second end of the k-th complementary bit line BLBk and a second end of the k-th auxiliary complementary bit line ABLBk.

The first switch SW1, the second switch SW2, the third switch SW3, and the fourth switch SW4 may be turned on in response to the write signal WS provided by the controller 200.

Therefore, the first switch SW1, the second switch SW2, the third switch SW3, and the fourth switch SW4 coupled to the bit line BLk and the complementary bit line BLBk corresponding to a same memory cell 101 may be turned on substantially simultaneously in response to the write signal WS. The first switch SW1, the second switch SW2, the third switch SW3, and the fourth switch SW4 may be turned on during the write operation, and may be turned off during the read operation.

In an exemplary embodiment, a single signal may be used as both the write signal WS and the write enable signal W_EN. For example, a single signal may be used as both the write signal WS and the write enable signal W_EN in a single bank architecture. In the single-bank architecture, the memory cell array shown in FIG. 2 may include the first switch SW1, the second switch SW2, the third switch SW3, and the fourth switch SW4, and a single multiplexer may be utilized. In an exemplary embodiment, a multi-bank architecture may be utilized in which the write signal WS and the write enable signal W_EN are separate signals, the memory cell array shown in FIG. 2 includes the first switch SW1 and the third switch SW3, and does not include the second switch SW2 and the fourth switch SW4, and in which a plurality of multiplexers are utilized.

In an exemplary embodiment, the write signal WS may have a first value indicating a write operation, and a second value indicating a read operation.

In an exemplary embodiment in which the memory cell array shown in FIG. 2 includes the first switch SW1, the second switch, the third switch SW3, and the fourth switch SW4, the first switch SW1 and the second switch SW2 may electrically connect the k-th auxiliary bit line ABLk to the k-th bit line BLk in response to receiving the write signal having the first value indicating the write operation, and may electrically disconnect the k-th auxiliary bit line ABLk from the k-th bit line BLk in response to receiving the write signal having the second value indicating the read operation. Further, the third switch SW3 and the fourth switch SW4 may electrically connect the k-th auxiliary complementary bit line ABLBk to the k-th complementary bit line BLBk in response to receiving the write signal having the first value indicating the write operation, and may electrically disconnect the k-th auxiliary complementary bit line ABLBk from the k-th complementary bit line BLBk in response to receiving the write signal having the second value indicating the read operation.

In an exemplary embodiment in which the memory cell array shown in FIG. 2 includes the first switch SW1 and the third switch SW3, and does not include the second switch SW2 and the fourth switch SW4, the first switch SW1 may electrically connect the k-th auxiliary bit line ABLk to the k-th bit line Bll in response to receiving the write signal having the first value indicating the write operation, and may electrically disconnect the k-th auxiliary bit line ABLk from the k-th bit line BLk in response to receiving the write signal having the second value indicating the read operation.

Further, the third switch SW3 may electrically connect the k-th auxiliary complementary bit line ABLBk to the k-th complementary bit line BLBk in response to receiving the write signal having the first value indicating the write operation, and may electrically disconnect the k-th auxiliary complementary bit line ABLBk from the k-th complementary bit line BLBk in response to receiving the write signal having the second value indicating the read operation.

Therefore, during the write operation, the first switch SW1, the second switch SW2, the third switch SW3, and the fourth switch SW4 included in the switch circuit 110 may be turned on, such that the auxiliary bit line ABLk is electrically connected to the bit line BLk, and the auxiliary complementary bit line ABLBk is electrically connected to the complementary bit line BLBk.

Alternatively, during the read operation, the first switch SW1, the second switch SW2, the third switch SW3, and the fourth switch SW4 included in the switch circuit 110 may be turned off, such that the auxiliary bit line ABLk is electrically disconnected from the bit line BLk, and the auxiliary complementary bit line ABLBk is electrically disconnected from the complementary bit line BLBk.

In exemplary embodiments, during the write operation, the controller 200 may commonly provide the write signal WS to the plurality of first switches SW1, the plurality of second switches SW2, the plurality of third switches SW3, and the plurality of fourth switches SW4 included in the switch circuit 110. In this case, during the write operation, the first through m-th auxiliary bit lines ALB1~ABLm are electrically connected to the first through m-th bit lines BL1~BLm, respectively, and the first through m-th auxiliary complementary bit lines ABLB1~ABLBm are electrically connected to the first through m-th complementary bit lines BLB1~BLBm, respectively.

In exemplary embodiments, during the write operation, the controller 200 may provide the write signal WS only to the first switch SW1, the second switch SW2, the third switch SW3, and the fourth switch SW4 included in a column corresponding to the column address CA, rather than to every switch included in the switch circuit 110. In this case, during the write operation, the auxiliary bit line ABLk and the bit line BLk included in a column corresponding to the column address CA are electrically connected to each other, and the auxiliary complementary bit line ABLBk and the complementary bit line BLBk included in the column corresponding to the column address CA are electrically connected to each other.

In exemplary embodiments, a width of each of the first through m-th auxiliary bit lines ABL1~ABLm may be greater than a width of each of the first through m-th bit lines BL1~BLm. In addition, a width of each of the first through m-th auxiliary complementary bit lines ABLB1~ABLBm may be greater than a width of each of the first through m-th complementary bit lines BLB1~BLBm.

Further, in exemplary embodiments, the width of each of the first through m-th bit lines BL1~BLm. may be substantially equal to the width of each of the first through m-th complementary bit lines BLB1~BLBm, and the width of each of the first through m-th auxiliary bit lines ABL1~ABLm may be substantially equal to the width of each of the first through m-th auxiliary complementary bit lines ABLB1~ABLBm.

Generally, when a width of a metal line is relatively small, a resistance of the metal line is relatively great and a parasitic capacitance of the metal line is relatively small. Alternatively, when a width of a metal line is relatively great, a resistance of the metal line is relatively small and a parasitic capacitance of the metal line is relatively great.

As described above, in exemplary embodiments, the width of each of the first through m-th auxiliary bit lines ABL1~ABLm may be greater than the width of each of the first through m-th bit lines BL1~BLm, and the width of each of the first through m-th auxiliary complementary bit lines ABLB1~ABLBm may be greater than the width of each of the first through m-th complementary bit lines BLB1~BLBm. Therefore, a resistance of each of the first through m-th auxiliary bit lines ABL1—ABLm may be smaller than a resistance of each of the first through m-th bit lines BL1~BLm, and a parasitic capacitance of each of the first through m-th auxiliary bit lines ALB1~ABLm may be greater than a parasitic capacitance of each of the first through m-th bit lines BL1~BLm. In addition, a resistance of each of the first through moth auxiliary complementary bit lines ABLB1~ABLBm may be smaller than a resistance of each of the first through m-th complementary bit lines BLB1~BLBm, and a parasitic capacitance of each of the first through m-th auxiliary complementary bit lines ABLB1~ABLBm may be greater than a parasitic capacitance of each of the first through m-th complementary bit lines BLB1~BLBm.

As shown in FIGS. 1 and 2, the plurality of bit lines BL1~BLm, the plurality of complementary bit lines BLB1~BLBm, the plurality of auxiliary bit lines ALB1~ABLm, and the plurality of auxiliary complementary bit lines ABLB1~ABLBm extend in a first direction, and the plurality of word lines WL1~WLn extends in a second direction that crosses the first direction.

Figure 3:
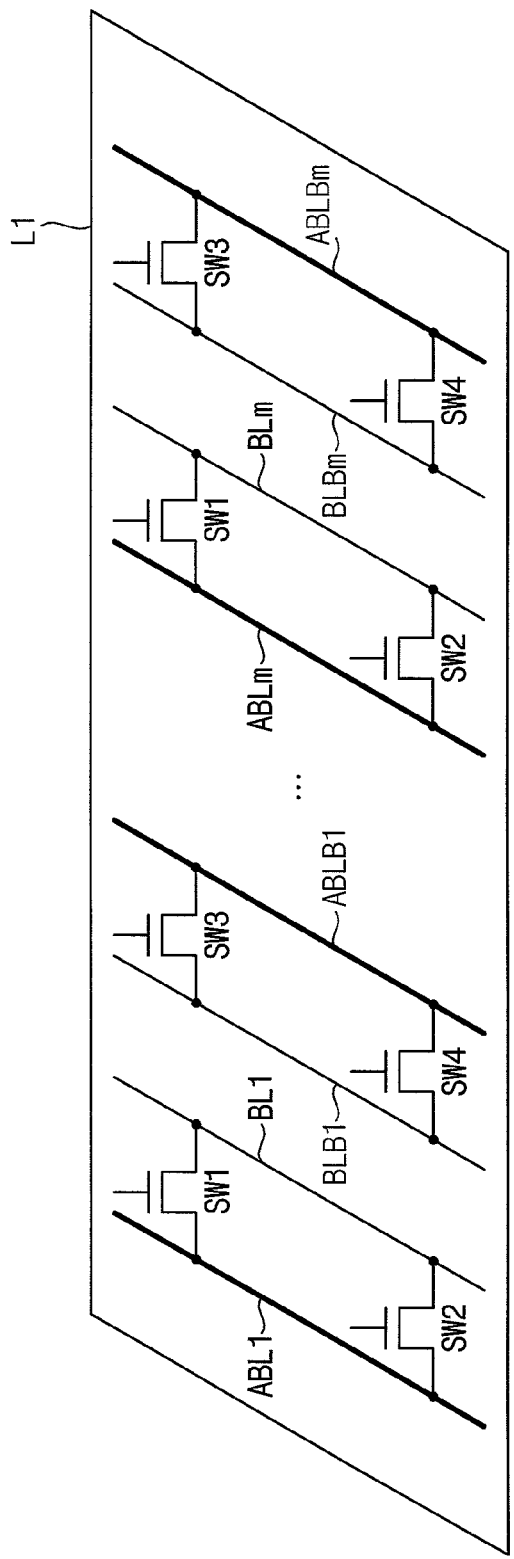
FIG. 3 is a diagram illustrating an example of an arrangement of a plurality of bit lines, a plurality of complementary bit lines, a plurality of auxiliary bit lines, and a plurality of auxiliary complementary bit lines included in the memory device of FIG. 1, according to an exemplary embodiment of the inventive concept.

FIG. 3 is a diagram illustrating an example of an arrangement of a plurality of bit lines, a plurality of complementary bit lines, a plurality of auxiliary bit lines, and a plurality of auxiliary complementary bit lines included in the memory device of FIG. 1, according to an exemplary embodiment of the inventive concept.

As illustrated in FIG. 3, in an exemplary embodiment, the first through m-th bit lines BL1~BLm, the first through m-th complementary bit BLB1~BLBm, the first through m-th auxiliary bit lines ABL1~ABLm, and the first through m-th auxiliary complementary bit lines ABLB1~ABLBm may be formed on a same layer L1.

In this case, the switch circuit 110 (switches SW1, SW2, SW3 and SW4) may be formed on the layer L1. During the write operation, the first through m-th bit lines BL1~BLm and the first through m-th auxiliary bit lines ALB1~ABLm may be electrically connected to each other through the switch circuit 110 formed on the layer L1, and the first through math complementary bit lines BLB1~BLBm and the first through m-th auxiliary complementary bit lines ABLB1~ABLBm may be electrically connected to each other through the switch circuit 110 formed on the layer L1.

Figure 4:
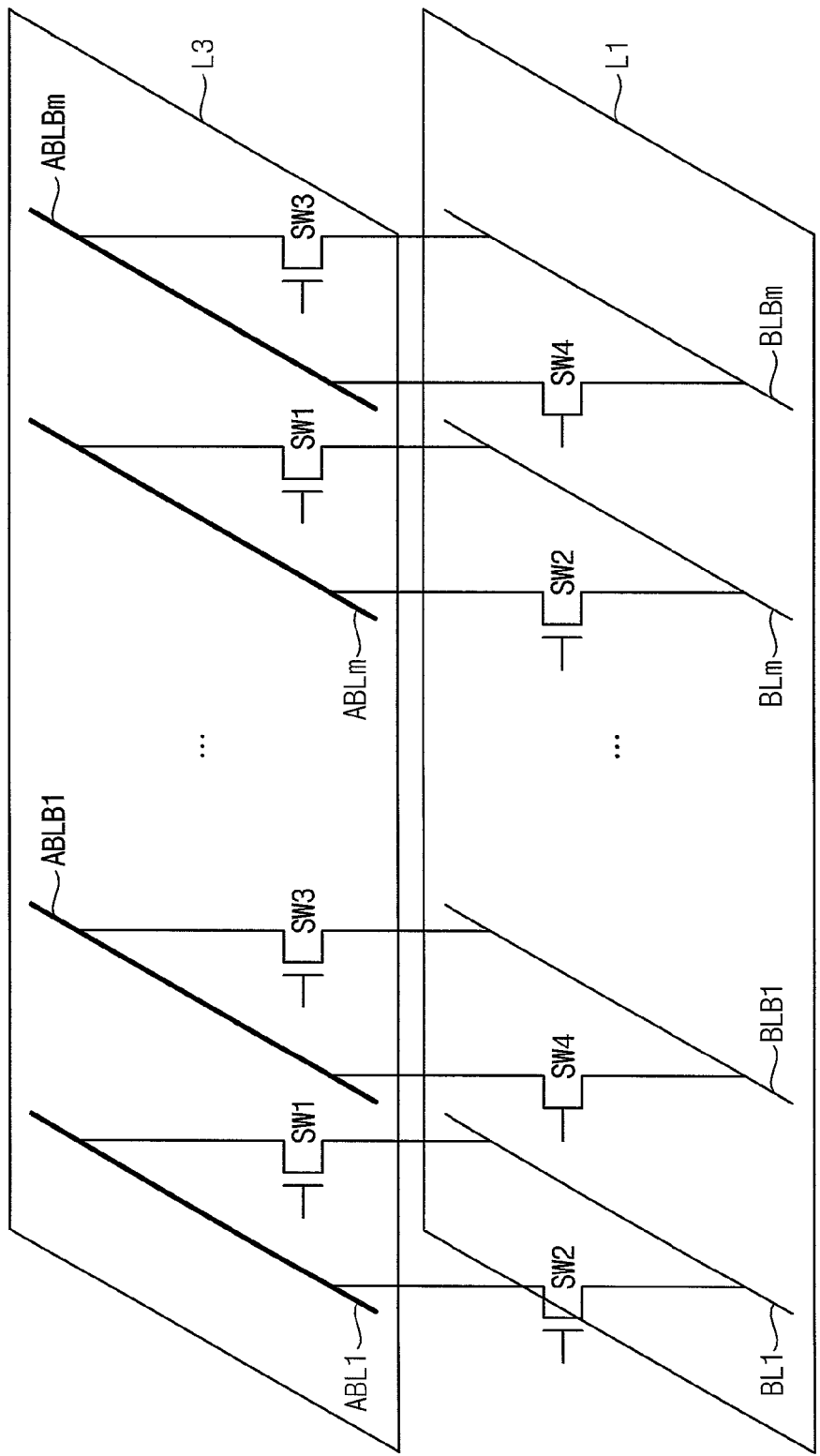
FIG. 4 is a diagram illustrating an example of an arrangement of a plurality of bit lines, a plurality of complementary bit lines, a plurality of auxiliary bit lines, and a plurality of auxiliary complementary bit lines included in the memory device of FIG. 1, according to an exemplary embodiment of the inventive concept.

FIG. 4 is a diagram illustrating an example of an arrangement of a plurality of bit lines, a plurality of complementary bit lines, a plurality of auxiliary bit lines, and a plurality of auxiliary complementary bit lines included in the memory device of FIG. 1, according to an exemplary embodiment of the inventive concept.

As illustrated in FIG. 4, in an exemplary embodiment, the first through m-th bit lines BL1~BLm and the first through m-th complementary bit lines BLB1~BLBm may be formed on a first layer L1, and the first through m-th auxiliary bit lines ABL1~ABLm and the first through m-th auxiliary complementary bit lines ABLB1~ABLBm may be formed on a third layer L3, which is located above the first layer L1.

In this case, the switch circuit 110 (e.g., switches SW1, SW2, SW3, and SW4) may be formed between the first layer L1 and the third layer L3. During the write operation, the first through m-th bit lines BL1~BLm and the first through m-th auxiliary bit lines ALB1~ABLm may be electrically connected to each other through the switch circuit 110 formed between the first layer L1 and the third layer L3, and the first through math complementary bit lines BLB1~BLBm and the first through m-th auxiliary complementary bit lines ABLB1~ABLBm may be electrically connected to each other through the switch circuit 110 formed between the first layer L1 and the third layer L3.

Figure 5:
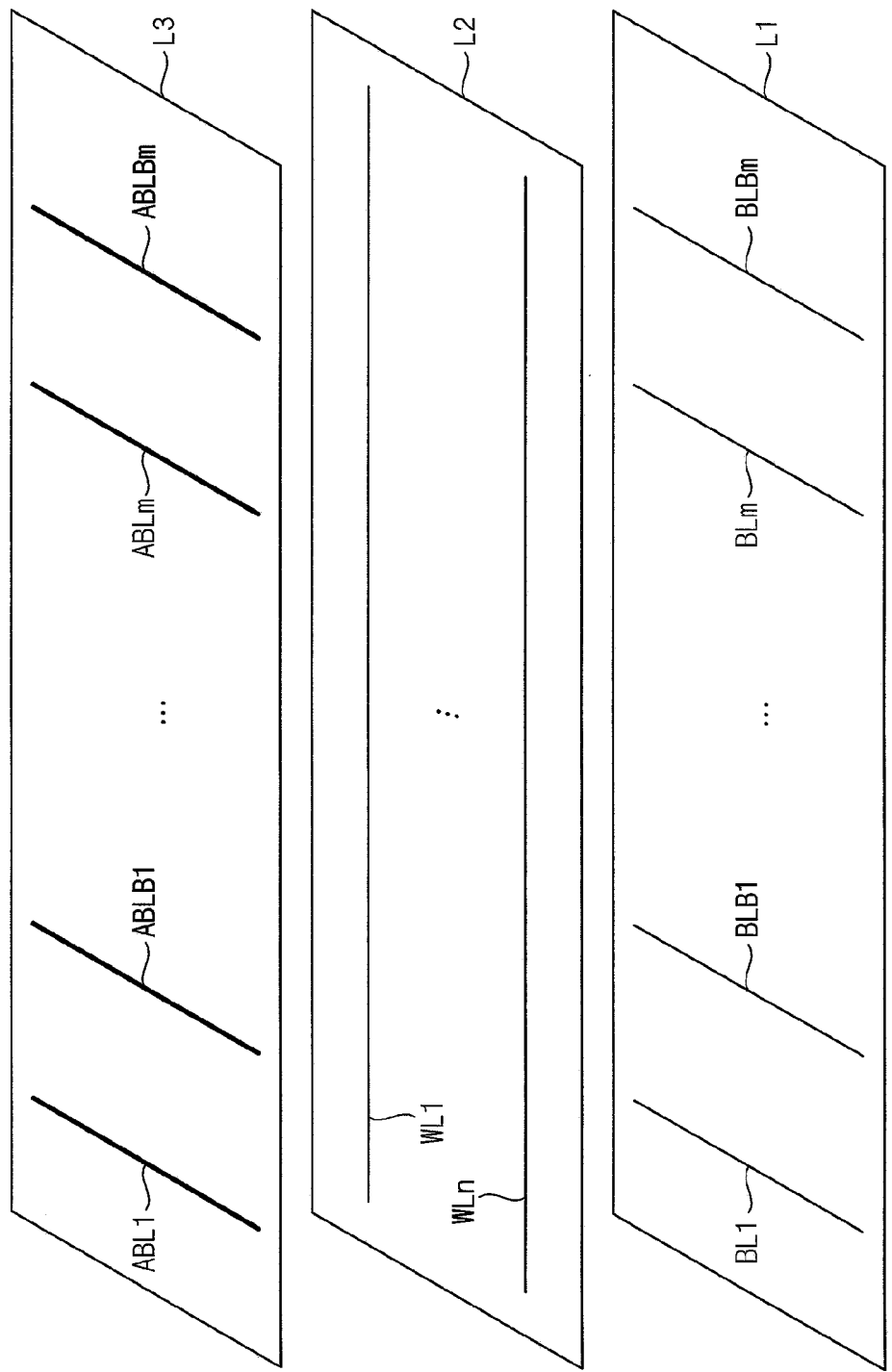
FIG. 5 is a diagram illustrating an example of an arrangement of a plurality of bit lines, a plurality of complementary bit lines, a plurality of auxiliary bit lines, and a plurality of auxiliary complementary bit lines included in the memory device of FIG. 1, according to an exemplary embodiment of the inventive concept.

FIG. 5 is a diagram illustrating an example of an arrangement of a plurality of word lines, a plurality of bit lines, a plurality of complementary bit lines, a plurality of auxiliary bit lines, and a plurality of auxiliary complementary bit lines included in the memory device of FIG. 1, according to an exemplary embodiment of the inventive concept.

The first layer L1 and the third layer L3 of FIG. 5 may be the same as the first layer L1 and the third layer L3 of FIG. 4. For convenience of explanation, the switch circuit 110, which is formed between the first layer L1 and the third layer L3, is not shown in FIG. 5.

Referring to FIG. 5, the first through n-th. word lines WL1~WLn included in the memory device 10 may be formed on a second layer L2, which is located between the first layer L1 and the third layer L3. For example, in FIG. 5, the second layer L2 is located above the first layer L1 and is located below the third layer L3.

In this case, the switch circuit 110, which is formed between the first layer L1 and the third layer L3, is formed such that it does not contact the first through n-th word lines WL1~WLn on the second layer L2.

Figure 6:
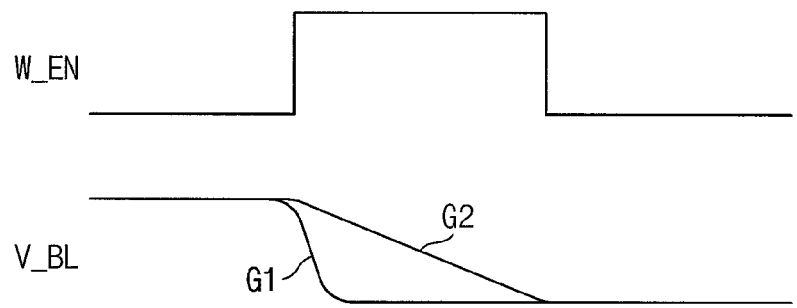
FIG. 6 is a diagram illustrating an increase in write performance of the memory device of FIG. 1 according to an exemplary embodiment of the inventive concept.

FIG. 6 is a diagram illustrating an increase in write performance of the memory device of FIG. 1 according to an exemplary embodiment of the inventive concept.

Referring to FIGS. 1, 2 and 6, during the write operation, a write driver 500 included in the memory device 10 may store one bit of data in a data storage circuit 103 of the memory cell 101 through the bit line BLk and the complementary bit line BLBk while the write enable signal W_EN is activated.

FIG. 6 represents a process of writing a bit of a logic low level in the memory cell 101 while the memory cell 101 stores a bit of a logic high level.

When the write driver 500 applies a voltage of a low level to the bit line BLk after the write enable signal W_N is activated, a voltage V_BL of the bit line BLk decreases from a logic high level to a logic low level.

When a resistance of the bit line BLk and a resistance of the complementary bit line BLBk are relatively small, the voltage V_BL of the bit line BLk may rapidly decrease from a logic high level to a logic low level, as indicated by G1 in FIG. 6.

Alternatively, when the resistance of the bit line BLk and the resistance of the complementary bit line BLBk are relatively great, the voltage V_BL of the bit line BLk may slowly decrease from a logic high level to a logic low level, as indicated by G2 in FIG. 6. In this case, the write operation may not complete before the write enable signal W_EN is deactivated, and a write error may occur.

As described above, in the memory device 10 according to exemplary embodiments of the inventive concept, during the write operation, the first through m-th auxiliary bit lines ABL1—ABLm, which may have a relatively great width, may be electrically connected to the first through m-th bit lines BL1~BLm, which may have a relatively small width, respectively. In addition, the first through m-th auxiliary complementary bit lines ABLB1~ABLBm, which may have a relatively great width, may be electrically connected to the first through m-th complementary bit lines BLB1~BLBm, which may have a relatively small width, respectively.

Therefore, according to exemplary embodiments of the inventive concept, during the write operation, an effective resistance of a bit line between the write driver 500 and the memory cell 101 is decreased. As a result, a write performance of the memory device 10 may be increased.

Figure 7:
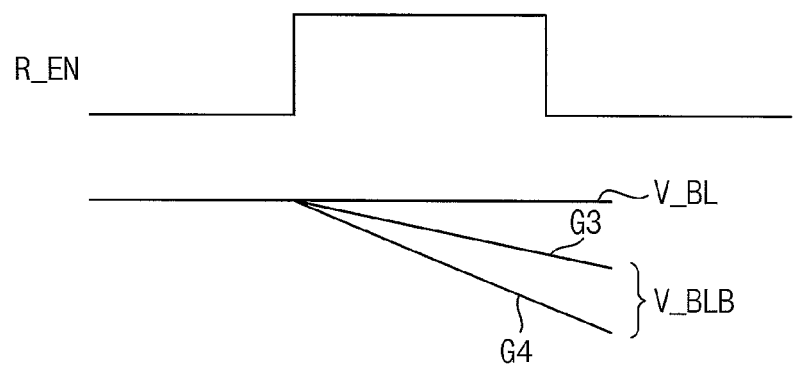
FIG. 7 is a diagram illustrating an increase in read performance of the memory device of FIG. 1 according to an exemplary embodiment of the inventive concept.

FIG. 7 is a diagram illustrating an increase in read performance of the memory device of FIG. 1 according to an exemplary embodiment of the inventive concept.

FIG. 7 represents a process of reading one bit of data from a memory cell 101 while the memory cell 101 stores a bit of a logic high level.

Referring to FIGS. 1, 2 and 7, after the read enable signal R_EN is activated, a voltage V_BL of the bit line BLk and a voltage V_BLB of the complementary bit line BLBk may be changed based on a logic level of data stored in the memory cell 101. While the read enable signal R_EN is activated, a sense amplifier 600 may determine a logic level of the data stored in the memory cell 101 based on a difference between the voltage V_BL of the bit line BLk and the voltage V_BLB of the complementary bit line BLBk. For example, a sense amplifier 600 that corresponds to the column address CA may generate data based on the difference between the voltage a selected bit line and a selected complementary bit line.

When a parasitic capacitance of the bit line BLk and a parasitic capacitance of the complementary bit line BLBk are relatively great, the voltage V_BLB of the complementary bit line BLBk may slowly decrease from a logic high level to a logic low level, as indicated by G3 in FIG. 7. In this case, the difference between the voltage V_BL of the bit line BLk and the voltage V_BLB of the complementary bit line BLBk may increase slowly, and as a result, a read error may occur.

Alternatively, when the parasitic capacitance of the bit line BLk and the parasitic capacitance of the complementary bit line BLBk are relatively small, the voltage V_BLB of the complementary bit line BLBk may rapidly decrease from a logic high level to a logic low level, as indicated by G4 in FIG. 7.

When the first through m-th auxiliary bit lines ALB1~ABLm, which may have a relatively great width, are electrically connected to the first through m-th bit lines BL1~BLm, which may have a relatively small width, respectively, and the first through m-th auxiliary complementary bit lines ABLB1~ABLBm, which may have a relatively great width, are electrically connected to the first through m-th complementary bit lines BLB1~BLBm, which may have a relatively small width, respectively, an effective parasitic capacitance of a bit line between the sense amplifier 600 and the memory cell 101 may be increased.

However, as described above, in the memory device 10 according to exemplary embodiments of the inventive concept, during the read operation, the first through m-th auxiliary bit lines ALB1~ABLm may be electrically disconnected from the first through m-th bit lines respectively, and the first through m-th auxiliary complementary bit lines ABLB1~ABLBm may be electrically disconnected from. the first through m-th complementary bit lines BLB1~BLBm, respectively.

Therefore, according to exemplary embodiments of the inventive concept, during the read operation, an effective parasitic capacitance of a bit line between the sense amplifier 600 and the memory cell 101 is decreased. As a result, a read performance of the memory device 10 may be increased.

Figure 8:
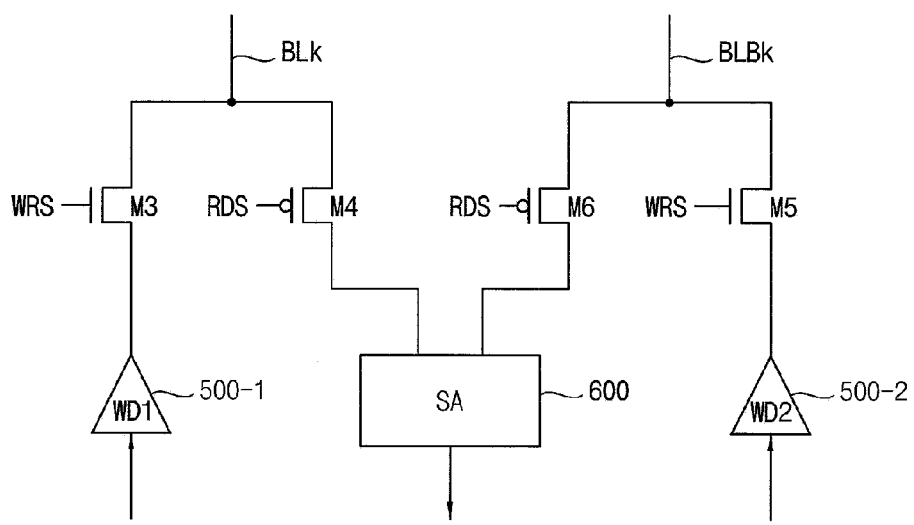
FIG. 8 is a block diagram illustrating an example of a multiplexer circuit included in the memory device of FIG. 1 according to an exemplary embodiment of the inventive concept.

FIG. 8 is a block diagram illustrating an example of a multiplexer circuit included in the memory device of FIG. 1 according to an exemplary embodiment of the inventive concept.

Referring to FIG. 8, in an exemplary embodiment, the multiplexer circuit 400 may include a third transistor M3 coupled between the bit line BLk and a first write driver 500-1, a fourth transistor M4 coupled between the bit line BLk and a sense amplifier 600, a fifth transistor M5 coupled between the complementary bit line BLBk and a second write driver 500-2, and a sixth transistor M6 coupled between the complementary bit line BLBk and the sense amplifier 600.

In exemplary embodiments, the third transistor M3 and the fifth transistor M5 may be, for example, an n-type metal oxide semiconductor (NMOS) transistor, and the fourth transistor M4 and the sixth transistor M6 may be, for example, a p-type metal oxide semiconductor (PMOS) transistor.

Referring to FIGS. 1 and 8, the multiplexer circuit 400 may internally generate a write selection signal WRS and a read selection signal RDS based on the column address CA, the write enable signal W_EN, and the read enable signal R_EN received from the controller 200.

For example, when the bit line BLk and the complementary bit line BLBk are selected based on the column address CA, the write selection signal WRS may be activated while the write enable signal W_EN is activated, and the read selection signal RDS may be activated while the read enable signal R_EN is activated.

Therefore, when the bit line BLk and the complementary bit line BLBk are selected based on the column address CA, the first write driver 500-1 may be coupled to the bit line BLk and the second write driver 500-2 may be coupled to the complementary bit line BLBk to perform the write operation while the write enable signal W_EN is activated.

Alternatively, when the bit line BLk and the complementary bit line BLBk are selected based on the column address CA, the sense amplifier 600 may be coupled to the bit line BLk and the complementary bit line BLBk to perform the read operation while the read enable signal R_EN is activated.

Figure 9:
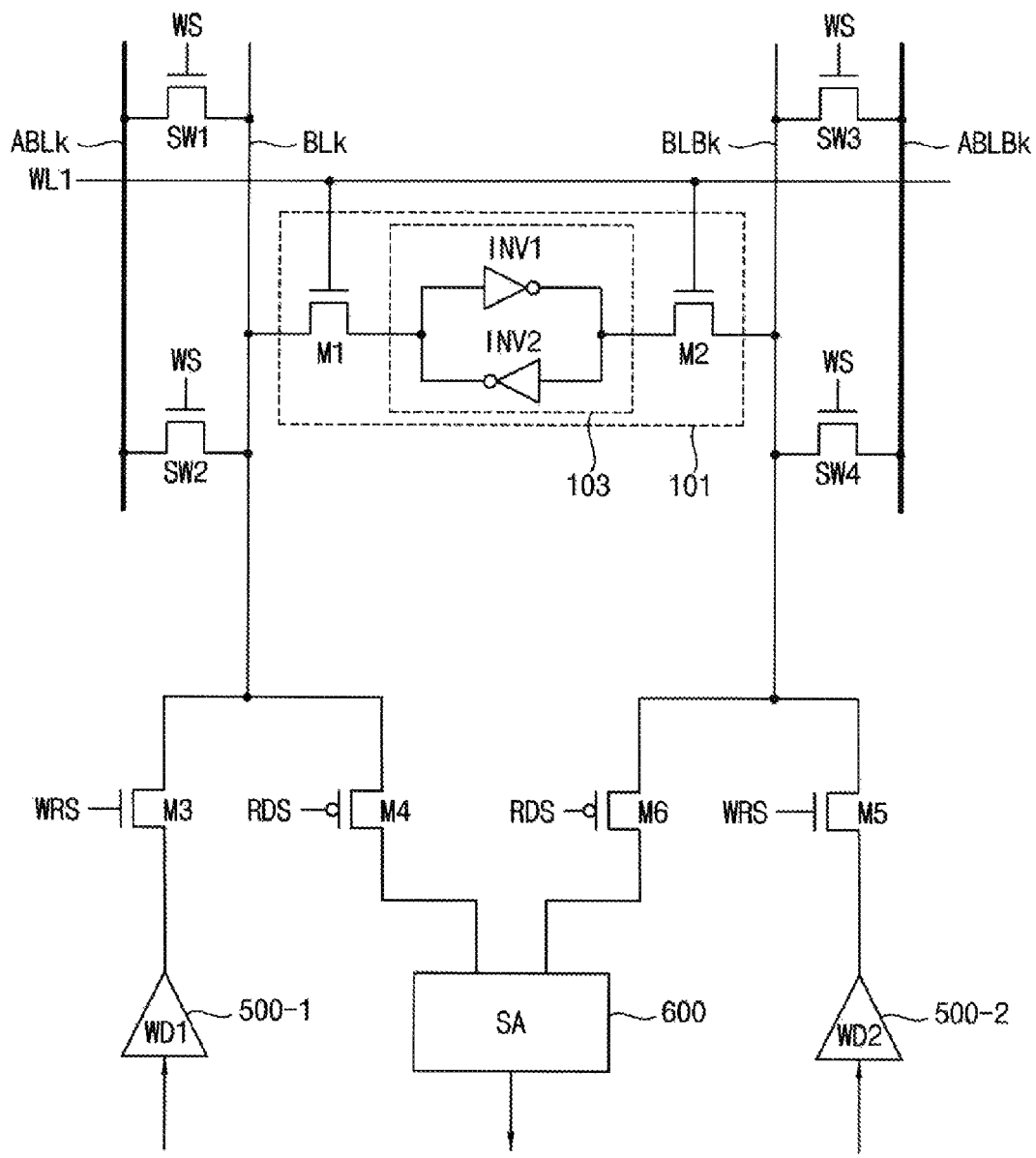
FIG. 9 is a diagram illustrating an operation of the memory device of FIG. 1 according to an exemplary embodiment of the inventive concept.

FIG. 9 is a diagram illustrating an operation of the memory device of FIG. 1 according to an exemplary embodiment of the inventive concept.

Referring to FIGS. 1 and 9, during the write operation, the controller 200 may provide the write signal WS in the activated state to the first switch SW1, the second switch SW2, the third switch SW3 and the fourth switch SW4 coupled to the selected bit line BLk and the selected complementary bit line BLBk.

Therefore, the first switch SW1, the second switch SW2, the third switch SW3, and the fourth switch SW4 may be turned on. As a result, the auxiliary bit line ABLk is electrically connected to the bit line BLk, and the auxiliary complementary bit line ABLBk is electrically connected to the complementary bit line BLBk.

In addition, the multiplexer circuit 400 may turn on the third transistor M3 and the fifth transistor M5. As a result, the first write driver 500-1 is coupled to the bit line BLk and the second write driver 500-2 is coupled to the complementary bit line BLBk.

Therefore, the first write driver 500-1 and the second write driver 500-2 may store data in the memory cell 101 through the bit line BLk and the complementary bit line BLBk.

Since the auxiliary bit line ABLk is electrically connected to the bit line BLk, and the auxiliary complementary bit line ABLBk is electrically connected to the complementary bit line BLBk, an effective resistance of the bit line BLk and an effective resistance of the complementary bit line BLBk may be decreased. As a result, a write performance of the memory device 10 may be increased.

Alternatively, during the read operation, the controller 200 may provide the write signal WS in the deactivated state to the first switch SW1, the second switch SW2, the third switch SW3, and the fourth switch SW4 coupled to the selected bit line BLk and the selected complementary bit line BLBk.

Therefore, the first switch SW1, the second switch SW2, the third switch SW3, and the fourth switch SW4 are turned off. As a result, the auxiliary bit line ABLk is electrically disconnected from the bit line BLk, and the auxiliary complementary bit line ABLBk is electrically disconnected from the complementary bit line BLBk.

In addition, the multiplexer circuit 400 may turn on the fourth transistor M4 and the sixth transistor M6. As a result, the sense amplifier 600 is coupled to the bit line BLk and the complementary bit line BLBk.

Therefore, the sense amplifier 600 may read data stored in the memory cell 101 based on a difference between the voltage V_BL of the bit line BLk and the voltage V_BLB of the complementary bit line BLBk.

Since the auxiliary bit line ABLk is electrically disconnected from the bit line BLk, and the auxiliary complementary bit line ABLBk is electrically disconnected from the complementary bit line BLBk, an effective parasitic capacitance of the bit line BLk and an effective parasitic capacitance of the complementary bit line BLBk may be decreased. Therefore, a read performance of the memory device 10 may be increased.

In addition, according to exemplary embodiments, since the memory device 10 is formed using the first through m-th auxiliary bit lines ABL1~ABLm and the first through m-th auxiliary complementary bit lines ABLB1~ABLBm, which correspond to passive elements, the memory device 10 may be formed in a small size with a low cost, while both a write performance and a read performance are improved.

Referring to the memory cell 101 shown in FIG. 9, a gate electrode of the first transistor M1 may be connected to the first word line WL1, a first electrode (e.g., a source or drain electrode) of the first transistor M1 may be connected to the k-th bit line BLk, and a second electrode (e.g., a source or drain electrode) of the first transistor M1 may be connected to the input electrode of the first inverter INV1. A gate electrode of the second transistor M2 may be connected to the first word line WL1, a first electrode (e.g., a source or drain electrode) of the second transistor M2 may be connected to the k-th complementary bit line BLBk, and a second electrode (e.g., a source or drain electrode) of the second transistor M2 may be connected to the input electrode of the second inverter INV2.

Referring to FIG. 9, the memory device 10 may be configured using a $V_{DD}$ pre-charge configuration or a $V_{ss}$ pre-charge configuration.

In the $V_{DD}$ pre-charge configuration, the first switch SW1, the second switch SW2, the third switch SW3, the fourth switch SW4, the first transistor M1, the second transistor M2, the third transistor M3, and the fifth transistor M5 are each an NMOS transistor, and the fourth transistor M4 and the sixth transistor M6 are each a PMOS transistor.

In the $V_{ss}$ pre-charge configuration, the first switch SW1, the second switch SW2, the third switch SW3, the fourth switch SW4, the first transistor M1, the second transistor M2, the third transistor M3, and the fifth transistor M5 are each a PMOS transistor, and the fourth transistor (M4) and the sixth transistor (M6) are each an NMOS transistor.

According to exemplary embodiments of the inventive concept, an effective resistance of each of the plurality of bit lines BL1~BLm and each of the plurality of complementary bit lines BLB1~BLBm during a write operation is less than the effective resistance of each of the plurality of bit lines BL1~BLm and each of the plurality of complementary bit lines BLB1~BLBm during a read operation. Further, an effective parasitic capacitance of each of the plurality of bit lines BL1~BLm and each of the plurality of complementary bit lines BLB1~BLBm during a read operation is less than the effective parasitic capacitance of each of the plurality of bit lines BL1~BLm and each of the plurality of complementary bit lines BLB1~BLBm during a write operation.

Figure 10:
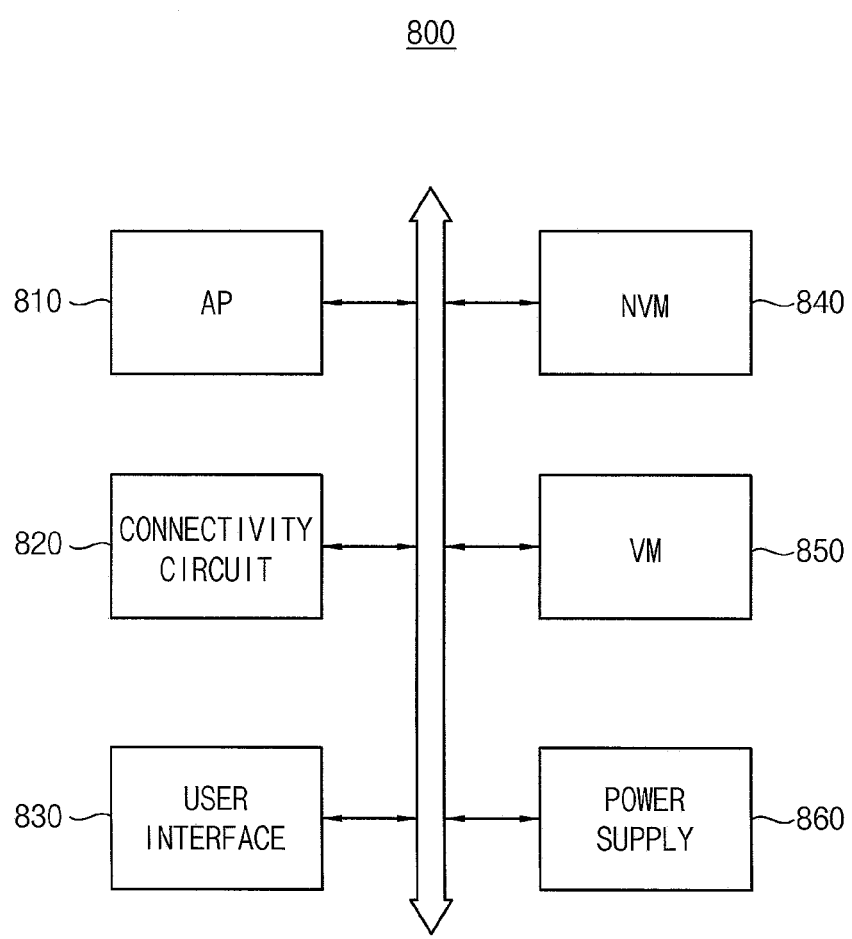
FIG. 10 is a block diagram illustrating a mobile system according to an exemplary embodiment of the inventive concept.

FIG. 10 is a block diagram illustrating a mobile system according to an exemplary embodiment of the inventive concept.

Referring to FIG. 10, a mobile system 800 includes an application processor AP 810, a connectivity circuit 820, a user interface 830, a nonvolatile memory device NVM 840, a volatile memory device VM 850, and a power supply 860. In exemplary embodiments, the mobile system 800 may be, for example, a mobile phone, a smartphone, a personal digital assistant to (PDA), a portable multimedia player (PMP), a digital camera, a music player, a portable game console, a navigation system, etc.

The application processor 810 may execute applications such as, for example, a web browser, a game application, a video player, etc.

The connectivity circuit (also referred to as a network interface) 820 may perform wired or wireless communication with an external device.

The volatile memory device 850 may store data processed by the application processor 810 or may operate as a working memory. The volatile memory device 850 may be the memory device 10 of FIG. 1. A structure and an operation of the memory device 10 of FIG. 1 are described above with reference to FIGS. 1 to 9. Therefore, a further detailed description of the volatile memory device 850 is omitted herein.

The nonvolatile memory device 840 may store a boot image for booting the mobile system 800.

The user interface 830 may include at least one input device such as, for example, a keypad, a touch screen, etc., and at least one output device such as, for example, a speaker, a display device, etc. The power supply 860 may supply a power supply voltage to the mobile system 800.

In exemplary embodiments, the mobile system 800 may further include an image processor and/or a storage device such as, for example, a memory card, a solid state drive (SSD), etc.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A memory device, comprising:
   a memory cell that stores a single bit;
   a word line connected to the memory cell;
   a bit line connected to the memory cell;
   a complementary bit line connected to the memory cell;
   an auxiliary bit line;
   an auxiliary complementary bit line; and
   a switch circuit, wherein the switch circuit electrically connects the auxiliary bit line to the bit line during a write operation, electrically connects the auxiliary complementary bit line to the complementary bit line during the write operation, electrically disconnects the auxiliary bit line from the bit line during a read operation, and electrically disconnects the auxiliary complementary bit line from the complementary bit line during the read operation.

2. The memory device of claim 1, wherein the bit line, the complementary bit line, the auxiliary bit line, and the auxiliary complementary bit line extend in a first direction.

3. The memory device of claim 2, wherein the word line extends in a second direction that crosses the first direction.

4. The memory device of claim 1, Wherein a width of the auxiliary bit line is greater than a width of the bit line.

5. The memory device of claim 4, wherein a width of the auxiliary complementary bit line is greater than a width of the complementary bit line.

6. The memory device of claim 5, wherein the width of the bit line is substantially equal to the width of the complementary bit line.

7. The memory device of claim 6, wherein the width of the auxiliary bit line is substantially equal to the width of the auxiliary complementary bit line.

8. The memory device of claim 1, wherein the memory cell comprises a first transistor, a second transistor, and a data storage circuit.

9. The memory device of claim 8, wherein the data storage circuit comprises:
   a first inverter comprising an input electrode and an output electrode; and
   a second inverter comprising an input electrode and an output electrode,
   wherein the output electrode of the first inverter is connected to the input electrode of the second inverter, and the output electrode of the second inverter is connected to the input electrode of the first inverter.

10. The memory device of claim 9,
    wherein a gate electrode of the first transistor is connected to the word line, a first electrode of the first transistor is connected to the bit line, and a second electrode of the first transistor is connected to the input electrode of the first inverter,
    wherein a gate electrode of the second transistor is connected to the word line, a first electrode of the second transistor is connected to the complementary bit line, and a second electrode of the second transistor is connected to the input electrode of the second inverter.

11. The memory device of claim 10, wherein the switch circuit comprises:
    first switch connected between a first end of the bit line and a first end of the auxiliary bit line;
    a second switch connected between a second end of the bit line and a second end of the auxiliary bit line;
    a third switch connected between a first end of the complementary bit line and a first end of the auxiliary complementary bit line; and a fourth switch connected between a second end of the complementary bit line and a second end of the auxiliary complementary bit line.

12. The memory device of claim 11, wherein the first switch, the second switch, the third switch, and the fourth switch are turned on at substantially the same time in response to the switch circuit receiving a write signal.

13. The memory device of claim 11, wherein the first switch, the second switch, the third switch, and the fourth switch are turned on during the write operation.

14. The memory device of claim 11, wherein the first switch, the second switch, the third switch, and the fourth switch are turned off during the read operation.

15. The memory device of claim 1, wherein the bit line, the complementary bit line, the auxiliary bit line, the auxiliary complementary bit line, and the switch circuit are formed on a same layer in the memory device.

16. The memory device of claim 1, wherein the bit line and the complementary bit line are formed on a first layer in the memory device, the auxiliary bit line and the auxiliary complementary bit line are formed on a third layer in the memory device, and the switch circuit is formed between the first layer and the third layer.

17. The memory device of claim 1,
   wherein an effective resistance of the bit line and the complementary bit line during the write operation is less than the effective resistance of the bit line and the complementary bit line during the read operation,
   wherein an effective parasitic capacitance of the bit line and the complementary bit line during the read operation is less than the effective parasitic capacitance of the bit line and the complementary bit line during the write operation.

18. The memory device of claim 1, wherein the memory device is a static random access memory (SRAM) device.

19. A memory device, comprising:
   a memory cell array comprising a plurality of memory cells;
   a plurality of word lines connected to the plurality of memory cells;
   a plurality of bit lines connected to the plurality of memory cells;
   a plurality of complementary bit lines connected to the plurality of memory cells;
   a plurality of auxiliary bit lines;
   a plurality of auxiliary complementary bit lines; and
   a switch circuit, wherein the switch circuit electrically connects the plurality of auxiliary bit lines to the plurality of bit lines in response to receiving a write signal having a first value indicating a write operation, electrically connects the plurality of auxiliary complementary bit lines to the plurality of complementary bit lines in response to receiving the write signal having the first value indicating the write operation, electrically disconnects the plurality of auxiliary bit lines from the plurality of bit lines in response to receiving the write signal having a second value indicating a read operation, and electrically disconnects the plurality of auxiliary complementary bit lines from the plurality of complementary bit lines in response to receiving the write signal having the second value indicating the read operation.

20. A memory device, comprising:
   a memory cell that stores a single bit
   a word line connected to the memory cell;
   a bit line connected to the memory cell;
   a complementary bit line connected to the memory cell;
   an auxiliary bit line;
   an auxiliary complementary bit line;
   a first switch connected between the bit line and the auxiliary bit line, wherein the first switch electrically connects the auxiliary bit line to the bit line in response to receiving a write signal having a first value indicating a write operation, and electrically disconnects the auxiliary bit line from the bit line in response to receiving the write signal having a second value indicating a read operation; and
   a second switch connected between the complementary bit line and the auxiliary complementary bit line, wherein the second switch electrically connects the auxiliary complementary bit line to the complementary bit line in response to receiving the write signal having the first value indicating the write operation, and electrically disconnects the auxiliary complementary bit line from the complementary bit line in response to receiving the write signal having the second value indicating the read operation.

* * * * *